United States Patent [19]

Hooker

[11] Patent Number: 4,542,905
[45] Date of Patent: Sep. 24, 1985

[54] GAME WITH AN ELECTROMAGNETIC BALL DETECTOR

[75] Inventor: Donald E. Hooker, Glen Ellyn, Ill.

[73] Assignee: Bally Manufacturing Corporation, Chicago, Ill.

[21] Appl. No.: 424,618

[22] Filed: Sep. 27, 1982

[51] Int. Cl.⁴ ............................................. A63B 71/00
[52] U.S. Cl. ............................. 273/121 A; 273/181 E; 273/127 R
[58] Field of Search ................ 273/11 C, 11 R, 58 G, 273/121 A, 127 R, 47, 54 C, 118 A, 119 A, 126 A, 238, 44, 29 R, 54 D, 371; 200/61.11

[56] References Cited

U.S. PATENT DOCUMENTS

| | | | |
|---|---|---|---|
| 2,184,867 | 12/1939 | Williams et al. | 273/119 A |
| 2,524,546 | 10/1950 | Sinclaire | 273/118 A |
| 2,574,721 | 11/1951 | Von Stoeser | 273/119 A |
| 2,966,561 | 12/1980 | Durant | 273/118 A |
| 3,843,132 | 10/1974 | Ferguson | 273/238 |
| 4,015,845 | 4/1977 | Sines | 273/11 C |
| 4,097,047 | 6/1978 | Ochi | 273/127 R |
| 4,116,435 | 9/1978 | Sines et al. | 273/11 R |
| 4,260,156 | 4/1981 | Momura | 273/127 R |
| 4,391,447 | 7/1983 | Dudley | 273/238 |

FOREIGN PATENT DOCUMENTS

| | | |
|---|---|---|
| 3001924 | 7/1981 | Fed. Rep. of Germany . |
| 2011086 | 7/1979 | United Kingdom . |

*Primary Examiner*—Richard C. Pinkham
*Assistant Examiner*—MaryAnn Stoll
*Attorney, Agent, or Firm*—Todd S. Parkhurst

[57] ABSTRACT

A ball detector senses and signals the presence of a metal containing ball near preselected points on a game playfield. The ball detector is positioned to avoid contact with the ball and includes an electromagnet for generating a magnetic flux near the preselected points on the game playfield and a sensor for measuring the time rate of change of the magnetic flux induced by passage of the ball through the magnetic flux.

13 Claims, 3 Drawing Figures

GAME WITH AN ELECTROMAGNETIC BALL DETECTOR

This invention relates, generally, to games with remote sensors. More particularly, this invention relates to magnetic sensors for use in games having moving ferromagnetic projectiles. Even more particularly, this invention relates to magnetic sensors for use in games characterized by having at least one ferromagnetic projectile moving on a surface. The well-known game of pinball is one, but by no means an exclusive, example of such games.

BACKGROUND OF THE INVENTION

There are many amusement games known which are characterized by the presence of a surface, or playfield, on which a ferromagnetic projectile such as a steel ball moves. The projectile may be given an initial impulse by a player from a lower to higher point of a playfield, where it then ricochets from a stop and moves back down the playfield in a random-appearing manner, bouncing off posts and other obstacles. In another variety of such game, a steel ball may be aimed and projected at a target point of a planar playfield that is substantially level with respect to the local gravitational vector. In yet another example of such game, the playfield may have substantial deviations from flatness; for example, it might be bowl-shaped. The foregoing are given by way of example only and are not intended to be exhaustive of the class of games considered herein. Other games may be considered in which the projectile has a free fall trajectory during at least part of its travel.

In any of the games considered it may be desirable to detect the position of the moving ferromagnetic projectile without perceptibly affecting the motion of the projectile across the playfield. A pinball game, for example, may have a special alley for a ball to pass through unimpeded, but if the passage occurs at certain times a bonus score is awarded. The active, or bonus periods, might be indicated by lighting of appropriate indicator lights. Alternatively, in games played with aimed projectiles on a substantially flat level surface, it may be desirable to have sequences of moving target points at which steel balls may be fired and scores awarded if the ball rolls over the moving target points. Such games, which are known as "gun games", may be made to operate very much like video games that feature targets which may be shot at and "destroyed" by a player.

SUMMARY OF THE INVENTION

The present invention is related to apparatus for detecting the passage of a moving ferromagnetic projectile without perceptibly impeding the motion of the projectile and to games utilizing such apparatus. In most games considered herein the projectile will be moving on the surface of a playfield. The means and method envisioned utilizes the ferromagnetic property of the projectile for detection purposes.

Broadly stated, one embodiment of the present invention is utilized in a game having a playing surface on which at least one ferromagnetic projectile moves. Detectors, or sensors, are located off the surface. They are buried, for example, beneath points on the surface so that the projectile does not make contact with the sensors. A sensor built in accordance with one aspect of the present invention has means for generating magnetic flux and means for generating an electrical voltage proportional to the time rate of change of the flux, the voltage being used as an electrical signal. The sensor is positioned with respect to a point on the playing surface to cause maximum change in the flux when a ferromagnetic projectile passes directly over that point. Associated with the sensor is counting means such as an amplifier for amplifying the electrical signal and a digital counter. The amplifier and counter threshold respond only to voltages greater than some value determined by the amplifier and counter characteristics. Alternatively, the counting means could include some other suitable electronic device such as a Schmitt trigger circuit having an output which might be used as an input to a microcomputer or to control directly lights and sounds associated with the game.

A specific construction exemplifying an embodiment of the present invention could include a pinball game such as is described in U.S. patent application Ser. No. 349,298 by Halliburton, R. D., Pearson, J. H., and Sava, R. J. entitled "Panic Post for Pinball Games" assigned to the assignee of the present invention, and included herein by reference. The specific construction for use with the pinball game might comprise a bar magnet, as a source of magnetic flux, fixed to an undersurface of a gameboard the upper surface of which comprises the playfield of the pinball game. Accordingly, the pinball game of the example also includes a ball, means for propelling the ball onto the playfield, one or more pivotally mounted flippers disposed near the playfield for affecting motion of the ball, contact points on the playfield cooperating with means for scoring contacts between the ball and the contact points, an out-hole and passages leading to the out-hole through which the ball may pass during the play of the game. The ball, which would be of steel in the context of the present invention, is propelled onto the playfield at substantial velocity in the direction of increasing height of the playfield. The ball then recoils from the top of the playfield or from obstacles on the playfield in a manner well known to spectators of such games. In the particular game described, therefore, the ball functions as a ferromagnetic projectile moving on the gameboard. The bar magnet fixed underneath the gameboard may be oriented so that an axis passing through the north and south poles of the bar magnet and substantially centered in the bar magnet would be perpendicular to the playfield. Either the north or south pole of the bar magnet is then located a short distance below the surface of the playfield on which the projectiles move. The magnetic detection sensor necessarily includes retaining means for retaining the magnetic means, which in this case is the bar magnet, against the gameboard undersurface. The bar magnet of the specific construction is wrapped with a coil of electrically conductive wire which thereby provides a solenoidal coil having a solenoidal axis retained in a position that is substantially coincident with the axis of the bar magnet. One end of the coil may be terminated in a ground connection, and the other end provides an output lead from the coil.

It may be seen from the foregoing description that the passage of a moving ferromagnetic projectile on the surface of the playfield may temporarily modify the magnetic field of the bar magnet. The modification results from the change in the magnetic path provided by the ferromagnetic ball and will be appreciable if the ball passes close to a pole of the bar magnet. The modification of the magnetic field of the bar magnet will cause a time variation of the magnetic flux inside the solenoidal coil which in turn, through the well-known laws of electromagnetism, induces a voltage between the terminals of the solenoidal coil. The voltage will be proportional to the rate of change of the flux which, on any given path, is substantially proportional to the velocity with which the ball moves. Detection of voltages greater than a minimal value provides for a minimum speed of a moving ball that can be detected. The minimum speed on any path will, of course, increase according to an increasing distance of the closest point of approach of the path to the point directly opposite the nearer pole piece of the bar magnet.

The solenoid may be connected to the input circuit of a transistor amplifier. The output of the amplifier may be converted from analog to digital by a Schmitt trigger, and the digital signal fed into the main game control circuit. This input may then be used by the game circuit to perform desired game functions. The transistor amplifier and Schmitt trigger thereby comprise counting means connected between the solenoidal terminals which responds to voltage outputs across the terminals greater than some threshold value. The counting means will accordingly have a preset threshold for signalling events when the electrical voltage difference across the solenoidal terminals exceeds that threshold. As a result, the counting means will signal the passage of a projectile with more than minimum speed sufficiently close to the point directly above the pole of the bar magnet.

It is therefore an aspect of this invention to provide a sensor suitable for use in amusement games for detecting the passage of ferromagnetic objects. It is a further aspect of this invention to add to the excitement of projectile games by providing a sensor capable of detecting the passage of the ferromagnetic projectile without perceptibly interfering with the motion of the projectile. It is another aspect of this invention to provide a sensor for use in projectile games which detects the passage over a playing field of sufficiently rapid ferromagnetic objects but does not respond to very slow or stationary, or paramagnetic or diamagnetic projectiles. These and other aspects, features, and advantages of the invention will be apparent from the following description of a specific construction of one embodiment as illustrated in the accompanying drawings.

DETAILED DESCRIPTION OF A SPECIFIC CONSTRUCTION OF AN EMBODIMENT

Figure 1:
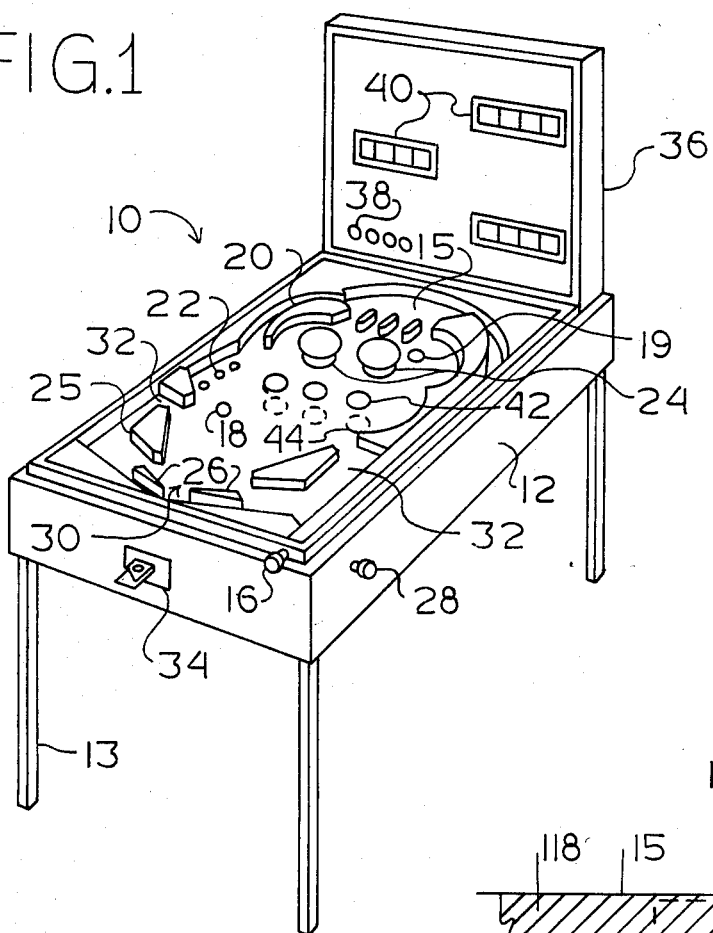
FIG. 1 illustrates a pinball machine suitable for use with the present invention and shows examples of exit passages and also of a pair of flippers.

Referring more specifically to FIG. 1, a pinball machine 10 includes a cabinet 12 supported on legs 13 approximately at waist height to the usual game player. The cabinet 12 has a glass top beneath which is located a slightly inclined bordered playfield 15. A manual ball-feeding mechanism 16 is located at the lower right-hand corner of the playfield and is used for ejecting a ball 18 to the upper end of the playfield 15 at the start of play. The ball then rolls under the influence of gravity downwardly over the slightly inclined playfield against and past a plurality of ball directing and target means located on the playfield.

In the illustrated apparatus, the ball directing and target means shown include kick-out holes 19, upper guide rails 20, spaced drop targets 22, thumper bumpers 24, and a slingshot kicker 25. Additionally, a pair of flippers 26 selectively controlled by manual left and right actuators 28 straddle and define a central out-of-play lane 30. A pair of side out-of-play lanes 32 are also defined on the sides of the playfield. Once the ball passes through one of the out-of-play lanes, it is lost; either a subsequent ball is then available to be put into play, or the game is over.

A coin mechanism 34 is located on the front of the cabinet to accept coins in the proper amount to enable play for the number of players desired. A back cabinet 36 is typically also provided, being glass covered and having suitable decorative and game operation material thereon. Thus, player indicating means 38 advises visually which player is playing, and the players' score area 40 provides continuous updated scores in digital display for the respective players. Other indicators can include a tilt notice, ball in play indicators, and flashing score-related lights not specifically identified.

The playfield may have flat scoring areas 42 comprising pieces of translucent plastic each with a lamp underneath. Each scoring area 42 is related to a sensor 44 concealed beneath the playfield, as shown for example in FIG. 2. When the ball traverses one of the sensors 44 the corresponding lamp may be caused to flash or darken. The scoring area 42 will accordingly provide an indication of the ball's passage over the sensor.

The game apparatus may vary widely with respect to the particulars of the scoring as the ball moves about the playfield and against the various ball directing means and/or target means. Basically, however, each ball directing or target means, upon being hit by the ball, redirects the ball, adds to the score of the player, or both. A control disclosed in Nutting et al. U.S. Pat. No. 4,093,232 or in Bracha et al. U.S. Pat. No. 4,198,051, both of which are incorporated herein by reference, can be provided for totaling the score and for illuminating the lights, according to some prearranged logic of the game apparatus, as the ball caroms about the playfield.

Figure 2:
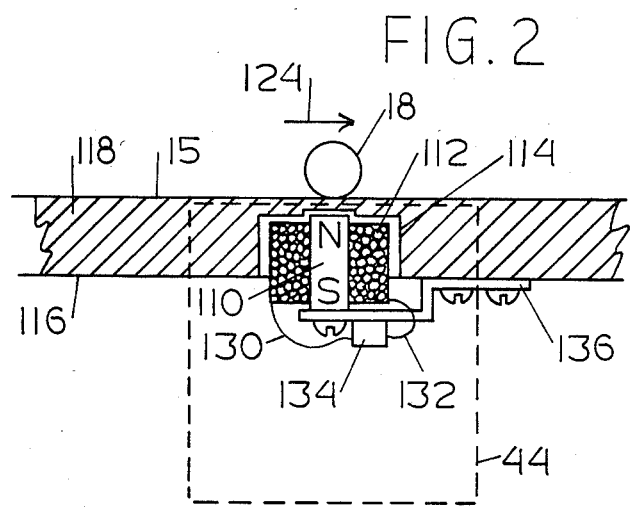
FIG. 2 illustrates a magnetic detection sensor retained on the undersurface of a gameboard in accordance with the principles of the present invention.

As shown in FIG. 2, the sensor 44 may comprise a bar magnet 110 wrapped with a solenoidal coil 112 may be inserted within the boundaries 114 defining an aperture on the underside 116 of a gameboard 118. The upper surface of the gameboard 118 is the playfield 15. The ball 18 is made of steel and acts as a ferromagnetic projectile in the game, moving in a direction indicated by an arrow 124. The terminals 130, 132 of the coil 112 connect to a counting circuit 134. The counting circuit 134 may be mounted on a retaining bracket 136 which also serves to hold the magnet 110 and coil 112 in place. It may be seen from FIG. 2, which exemplifies a possible specific construction of a preferred embodiment related to the present invention, that passage of the steel ball 18 directly above the bar magnet 110 will have the effect of altering the magnetic flux linking the solenoid 112. A voltage will thereby be generated between the coil terminals 130, 132 which will be proportional to the rate of change of the magnetic flux linking the solenoid, which rate of change in turn will be related to the speed and relative position of the steel ball 122. If the voltage is sufficiently large, it will cause a response by the counting circuit 134 and that response may be used as a game input.

It may accordingly be seen that FIG. 2 illustrates a magnetic detection sensor for use with a pinball game.

Figure 3:
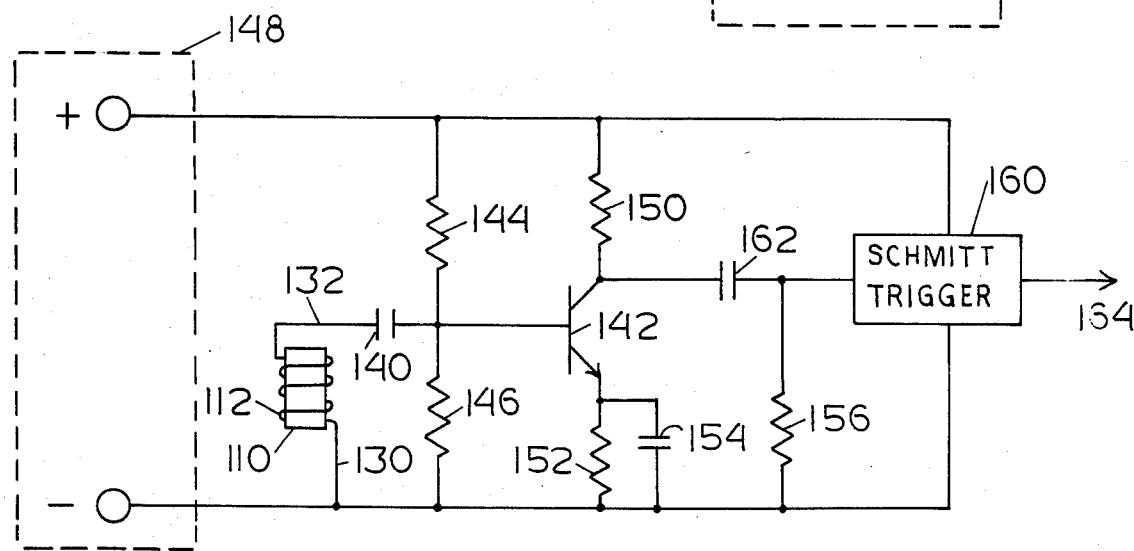
FIG. 3 is a diagram of a counting circuit suitable for use in accordance with the present invention with the sensor illustrated in FIG. 1.

FIG. 3 illustrates a construction of a counting circuit suitable for use in the specific construction illustrated in FIG. 2. The solenoid 112 is shown with its terminal 130 connected to ground and its terminal 132 connected to an input capacitor 140. The remaining terminal of the input capacitor 140 is connected to the base of a transistor 142, shown in FIG. 3 as an n-p-n transistor. A pair of bias resistors 144, 146 are connected in series between the terminals of a power supply 148 and their junction is connected to the base of the transistor 142. The power supply 148 positive terminal is connected to the collector of the transistor 142 through a load resistor 150. The negative terminal is connected to the emitter of the transistor 142 through a resistor 152 shunted by a capacitor 154. The negative terminal is also connected by a resistor 156 to the input of a Schmitt trigger 160. The input of the Schmitt trigger also connects to the collector of the transistor through a capacitor 162.

Voltage fluctuations from coil 112 are fed to the transistor 142 input through capacitor 140. Resistors 144, 146, 150 and 152 and the transistor 142 comprise a conventional amplifier circuit. Capacitor 154 prevents the emitter voltage from fluctuating with the base voltage. Capacitor 162 and resistor 156 form the input circuit to the Schmitt trigger 160. The output 164 of the Schmitt trigger may be used as input to the game control electronics.

It will, of course, be understood that modification of the present invention in its various aspects will be apparent to those skilled in the art, some being apparent only after study and others being a matter of routine design. The use of magnets other than bar magnets would fall within the teachings of the present invention, as would the use of other sources of magnetic flux. It is not necessary that all of the game projectiles be ferromagnetic; it may be desired in the game that some projectiles be undetectable by sensors of the present invention. It is further not at all necessary that the game surface be planar; it may be wavy or undulating. Alternatively, the projectile motion may not be completely confined to a surface but may have a free fall component. Accordingly, the scope of the invention should not be limited by the particular embodiment and specific construction herein described, but should be defined only be the appended claims and equivalents thereof.

What is claimed is:

1. A sensor for a game having a playfield surface with a preselected point and means for projecting a ferromagnetic projectile into motion on said playfield surface, said sensor comprising:

flux means for generating a magnetic flux having maximum strength substantially at said preselected point, and means for responding to a time rate of change of said magnetic flux caused by passage of the projectile through said flux by generation of an electrical signal proportional to the time rate of change in said magnetic flux and to projectile speed of passage, said means for responding and said flux means being positioned with respect to said surface to avoid contact with said ferromagnetic projectile;

said electrical signal outputted to a circuit, wherein the projectile must be travelling at a minimum projectile speed in order to generate an electrical signal for counting.

2. A sensor for a game having a playfield surface with a preselected point, a ferromagnetic projectile moving on said surface during play of the game, said sensor comprising:

a magnet wrapped in a solenoidal coil for providing a continous magnetic flux during game play and positioned with respect to said preselected point to avoid contact with said projectile; and means for generating an electrical signal, proportional to projectile speed of passage and time rate of change of said magnetic flux, produced when said projectile has a trajectpory traversing the neighborhood of said preselected point, said signal being maximal for fixed values os said projectile speed when said trajectory passes diretly over said point;

said electrical signal putputted to a circuit, wherein the projectile must be travelling at a minimum projectile speed in order to generate an electrical signal for counting.

3. A sensor according to claim 1 or 2 wherein said surface is substantially planar.

4. A sensor according to claim 3 wherein said surface is inclined to permit said projectile to move from a higher region to a lower region under the influence of gravity.

5. A sensor according to claim 4 wherein said game is a pinball game.

6. A sensor according to claim 1 or 2 wherein said flux means includes: magnetic means for producing a magnetic field having north and south poles and an axis passing through said poles, retaining means for retaining said magnetic means in position, said axis being substantially perpendicluar to said surface, a solenoidal coil of electrically conductive wire having a solenoidal axis substantially coincident with said magnetic means' axis, said solenoidal coil having terminals, and changes in said magnetic field inducing an electrical voltage difference between said terminals proportional to the time rate of change of said changes.

7. A sensor according to claim 6 wherein said magnetic means and said coil include a bar magnet wrapped with wire.

8. A sensor according to claim 1 or 2 wherein said sensor means has a predetermined threshold, said sensor means being responsive to said electrical signal when said signal exceeds said threshold.

9. A senor according to claim 8 wherein said sensor means comprises an amplifier and a Schmitt trigger.

10. A magnetic sensor for a pinball game having a ferromagnetic projectile moving on a gameboard during play of the game comprising:

magnetic means having north and south poles and an axis passing through said poles, for producing a magnetic flux;

retaining means for retaining said magnetic means below the gameboard, said axis being substantially perpendicular to the gameboard surface;

a solenoidal coil of electrically conductive wire having terminals and a solenoidal axis retained substantially coincident with said magnetic means axis so that the rate of change of said magnetic flux is caused by passage of the projectile through said flux, and generation of an electrical signal is proportional to the projectile speed of passage thereby inducing electrical voltage differences between said terminals; and counting means having a preset threshold connected between said terminals for signalling events when said electrical voltage differences exceed said threshold to signal the passage of said projectile, wherein the projectile must be travelling at a minimum projectile speed in order to generate an electrical signal for counting.

11. A magnetic sensor according to claim 10 wherein said magnetic means and said coil includes a bar magnet wrapped with wire.

12. A magnetic sensor according to claim 10 wherein said counting means comprises an amplifier and a Schmitt trigger.

13. In a game wherein at least one ferromagnetic projectile moves over the surface of a gameboard, a game projectile detector comprising:

magnetic flux generating means disposed beneath said surface, and magnetic sensing means disposed beneath said surface, and out of contact with any game projectile for responding to the time rate of change of said magnetic flux within said magnetic sensing means by producing a systematically related electrical signal, the disposition of said magnetic flux generating means relative to a predetermined point on said surface causing said rate of change of flux to be a maximum when said game projectile traverses said point, wherein passage of said projectile through said flux causes generation of an electrical signal proportional to the time rate of change of said magnetic flux and to projectile speed of passage, wherein the projectile must be travelling at a minimum projectile speed in order to generate an electrical signal for counting.

* * * * *